(12) United States Patent
Mori et al.

(10) Patent No.: US 6,389,683 B1
(45) Date of Patent: May 21, 2002

(54) APPARATUS AND METHOD FOR MOUNTING ELECTRONIC COMPONENT

(75) Inventors: Kazuo Mori, Kofu; Osamu Okuda, Yamanashi-ken; Hiroshi Uchiyama, Kofu; Akira Kabeshita, Hirakata, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/414,960

(22) Filed: Oct. 12, 1999

(30) Foreign Application Priority Data

Oct. 13, 1998 (JP) ............................................. 10-290355

(51) Int. Cl.⁷ ................................................. B23P 19/00
(52) U.S. Cl. .............................. 29/740; 29/741; 29/832; 29/840
(58) Field of Search .......................... 29/841, 840, 832, 29/741, 740

(56) References Cited

U.S. PATENT DOCUMENTS

| | | | | |
|---|---|---|---|---|
| 3,465,408 A | * | 9/1969 | Clark et al. |
| 3,492,713 A | * | 2/1970 | White |
| 4,283,847 A | * | 8/1981 | May |
| 5,435,481 A | | 7/1995 | Da Costa Alves et al. |
| 5,816,481 A | | 10/1998 | Economy et al. |
| 6,049,656 A | * | 4/2000 | Kim et al. |

* cited by examiner

*Primary Examiner*—Carl J. Arbes
(74) *Attorney, Agent, or Firm*—Wenderoth, Lind & Ponack, L.L.P.

(57) ABSTRACT

A solvent transfer unit is made a slide type and a plurality of nozzles at a head part which suck and hold components are moved down simultaneously to transfer the flux to electronic components. In comparison with an electronic component mounting method including a transfer operation whereby nozzles are lowered one by one by a conventional electronic component mounting apparatus equipped with a rotary type solvent transfer unit, a time for moving the nozzles up, down is shortened and a total cycle time is reduced, so that production efficiency is improved.

12 Claims, 11 Drawing Sheets

APPARATUS AND METHOD FOR MOUNTING ELECTRONIC COMPONENT

BACKGROUND OF THE INVENTION

The present invention relates to an apparatus and a method for mounting electronic components which carry out solvent transfer operation for transferring solvent such as flux, solder paste, or the like to electronic components requiring the transfer of the solvent at the time when the components are mounted to objects to be mounted such as boards or components.

Electronic component mounting apparatuses these days are required to mount electronic components speedily correctly to electronic circuit boards, with improving mounting quality.

An example of a conventional electronic component mounting apparatus will be described below with reference to FIGS. 14, 15, and 16.

A conventional electronic component mounting apparatus 10 shown in FIG. 14 comprises a board transfer device 4 for carrying in and out circuit boards, a front component feed device 32a and a rear component feed device 32b each having a plurality of component feed units, a head part 8 with a mechanism that can load desired suction nozzles, move up and down, and rotate the loaded suction nozzles, a board recognition camera 9, an XY robot 5 movable in X and Y directions, an electronic component image pickup device 2, and a solvent transfer unit 40.

The above conventional electronic component mounting apparatus 10 operates in a manner as follows. The board transfer device 4 transfers the circuit board to a mounting position. The XY robot 5 moves the board recognition camera 9 over the circuit board thereby checking positions where electronic components are to be mounted on the circuit board. The XY robot 5 then moves the board recognition camera 9 over the front component feed device 32a and the rear component feed part 32b and recognizes components 33 to be caught. Subsequently, the XY robot 5 lets the nozzles 8 hold the electronic components 33. The electronic components 33 sucked and held by the nozzles 8 are moved to the solvent transfer unit 40, where the components 33 are moved down one by one so that the flux 50 is transferred to each of the components 33. Attitudes of the electronic components 33 held by the nozzles 8 are picked up by the component image pickup device 2 and measured, thereby judging the result. When the measured result of the held attitudes of the components 33 is normal, the components 33 are corrected in position on the basis of the obtained image information. Thereafter the XY robot 5 is moved and the electronic components 33 are mounted onto the circuit board.

As shown in FIGS. 14, 15, and 16, in an example of the conventional equipment, the electronic component mounting apparatus 10 has the transfer unit 40 of a type rotating a transfer saucer 40b to approximately uniform a film thickness of the flux 50. The operation of the prior art apparatus 10 after sucking the electronic components will be described in detail hereinbelow. The head part 6 having a plurality of nozzles 8 for sucking and holding the electronic components 33 is moved by the XY robot 5 to the solvent transfer unit 40 of a rotary transfer saucer type. The head part 6, when reaching the solvent transfer unit 40 of a rotary transfer saucer type, lowers one of the plurality of sucked and held electronic components 33 to a transfer face of the transfer unit 40, whereby the flux 50 is transferred to the electronic component 33. After the electronic component 33 having the flux transferred thereto is moved up, the transfer saucer 40b is rotated by a motor 40d to approximately uniform a thickness of the flux 50 with a blade 40a. Thereafter, the nozzle 8 sucking and holding the next electronic component 33 is moved by the XY robot 5 to a transfer position, and moved down to transfer the flux 50. The process is repeatedly carried out for all components 33. The head part 6 is moved to a desired mounting position after the flux 50 is transferred to all of the sucked and held electronic components 33, where the electronic components 33 are mounted.

In the thus-constituted conventional electronic component mounting apparatus 10 with the solvent transfer unit 40 of a rotary transfer saucer type, the flux is transferred to only one electronic component 33 at each time although a plurality of the electronic components 33 are sucked and held. As such, the volatile content of the flux 50 transferred to a first electronic component 33 already volatilizes at the time when the flux is transferred to a last electronic component 33, thus causing degradation in mounting quality. A mounting time is increased, which leads to deterioration in production efficiency.

SUMMARY OF THE INVENTION

Accordingly, the present invention is devised to solve these issues and has for its object to provide an apparatus and a method for mounting electronic components which can curtail a loss which would be brought about in a process wherein solvent is transferred to electronic components one by one.

In accomplishing these and other aspects, according to a first aspect of the present invention, there is provided an electronic component mounting apparatus comprising:

a component feed device for feeding a plurality of electronic components;

an object support device for holding and positioning an object to which the electronic components are to be mounted;

a plurality of component holding members for holding the electronic components from the component feed device and mounting the held electronic components to predetermined positions on the object;

a component image pickup device for measuring attitudes of the electronic components held by the component holding members; and a flux transfer unit, comprising: a solvent transfer part for forming a film of a flux to be transferred to the components; and a film-forming blade for forming the solvent film at the solvent transfer part, for transferring the solvent to the electronic components by bringing the components held by the component holding members into touch with the solvent film simultaneously after the solvent film is formed by relatively and linearly sliding one of the solvent transfer part and the blade.

According to a second aspect of the present invention, there is provided an electronic component mounting apparatus according to the first aspect, wherein the solvent transfer unit has at the solvent transfer part a flat plane portion at which the solvent film is formed and has a driving part for relatively and linearly sliding one of the solvent transfer part and the film-forming blade, thereby regulating a film thickness of the solvent thereat through movement of the solvent transfer part or the blade thereby making the film thickness of the solvent approximately uniform.

According to a third aspect of the present invention, there is provided an electronic component mounting apparatus according to the first or second aspect, wherein the component feed device has cassette slots in which component feed cassettes, and the solvent transfer unit is capable of being inserted into one of the cassette slots of the component feed device to set the solvent transfer unit at the apparatus.

According to a fourth aspect of the present invention, there is provided an electronic component mounting apparatus according to any one of the first to third aspects, wherein in the solvent transfer unit, one of the solvent transfer part and the blade is slid in accordance with a component take-out signal indicating that the component is taken out by the component holding member from a component feed cassette attached at a cassette slot of the component feed device.

According to a fifth aspect of the present invention, there is provided an electronic component mounting apparatus according to any one of the first to fourth aspects, wherein the solvent transfer unit has the film-forming blade and a scraping blade for scraping unnecessary flux, and after the film of the flux is formed at the solvent transfer part by relatively and linearly sliding one of the solvent transfer part and the film-forming blade, the plural electronic components held by the component holding members are brought into contact with the film of the solvent to transfer the solvent to the held components, and after the solvent left at the solvent transfer part is scraped by the scraping blade, a new film of the solvent is formed at the solvent transfer part.

According to a sixth aspect of the present invention, there is provided an electronic component mounting apparatus according to any one of the first to fifth aspects, wherein the solvent transfer unit has a flat plane portion at the solvent transfer part, and when the solvent is transferred to the components, the solvent is transferred to bumps formed on electrodes of the plural electronic components while leveling the bumps by pressing the bumps against the flat plane portion of the solvent transfer part.

According to a seventh aspect of the present invention, there is provided an electronic component mounting method comprising:

relatively and linearly sliding one of a solvent transfer part and a film-forming blade in a flux transfer unit comprising the solvent transfer part at which a film of a flux to be transferred to electronic components is formed, and the film-forming blade for forming the solvent film at the solvent transfer part, thus forming the solvent film at the solvent transfer part; and thereafter transferring the solvent to the electronic components by bringing the components held by component holding members into touch with the film of the solvent simultaneously.

According to an eighth aspect of the present invention, there is provided an electronic component mounting method according to the seventh aspect, further comprising regulating a film thickness of the solvent at the solvent transfer part through movement of the solvent transfer part or the blade, thereby making the film thickness of the solvent approximately uniform.

According to a ninth aspect of the present invention, there is provided an electronic component mounting method according to the seventh or eighth aspect, wherein the solvent film is formed by driving the solvent transfer part or the blade in accordance with a component take-out signal indicating that the component is taken out by the component holding member from a component feed device for feeding the components.

According to a tenth aspect of the present invention, there is provided an electronic component mounting method according to any one of the seventh to ninth aspects, further comprising, after the plural electronic components held by the component holding members are brought into contact with the film of the solvent to transfer the solvent to the held components, scrapping the solvent left at the solvent transfer part by a scraping blade for scraping unnecessary flux, and then forming a new film of the solvent at the solvent transfer part.

According to an eleventh aspect of the present invention, there is provided an electronic component mounting method according to any one of the seventh to tenth aspects, wherein, when the solvent is transferred to the components, the solvent is transferred to bumps formed on electrodes of the plural electronic components while leveling the bumps by pressing the bumps against the flat plane portion of the solvent transfer part.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
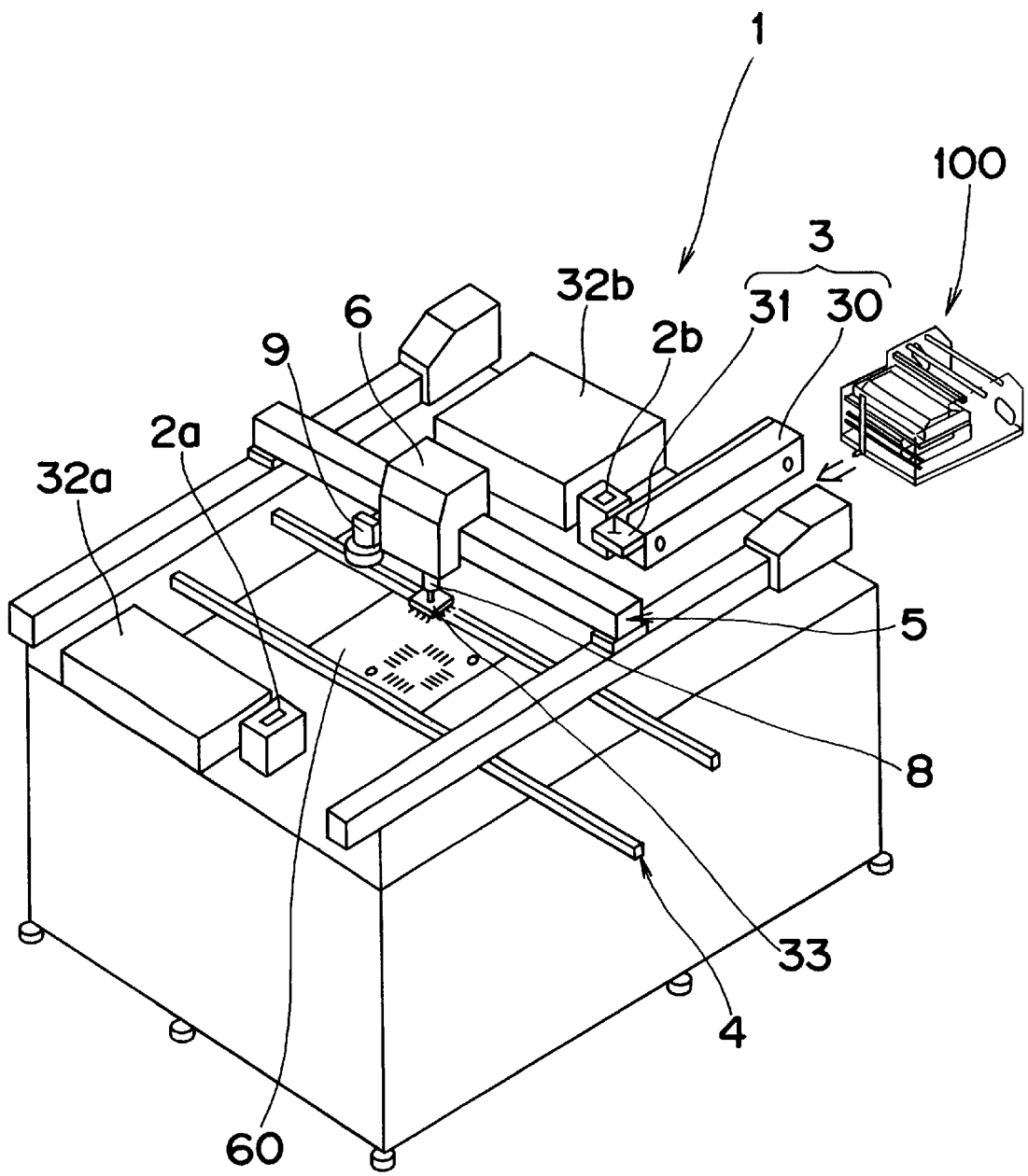
FIG. 1 is a perspective view of an electronic component mounting apparatus according to an embodiment of the present invention.

Before the description of the present invention proceeds, it is to be noted that like parts are designated by like reference numerals throughout the accompanying drawings.

A solvent transfer unit of an electronic component mounting apparatus according to an embodiment of the present invention is to carry out a solvent transfer operation for transferring solvent such as flux or the like to electronic components which are to be mounted onto objects to be mounted such as boards or components.

The electronic component mounting apparatus equipped with the above solvent transfer unit and, an electronic component mounting method including the solvent transfer operation of transferring the solvent to the electronic components with the use of the solvent transfer unit will be described below with reference to FIGS. 1, 2, 3, and 4.

In the embodiment, as examples of the solvent transfer unit and the solvent transfer operation, a flux transfer unit and a flux transfer operation using a flux by way of example of the solvent will be detailed hereinbelow. The solvent may be solder paste, organic solvent such as conductive paste, or the like, for example.

The description of the embodiment exemplifies the electronic component mounting apparatus and the electronic component mounting method whereby electronic components corresponding to components are automatically mounted onto circuit boards after held by nozzles as examples of component holding members.

Figure 2:
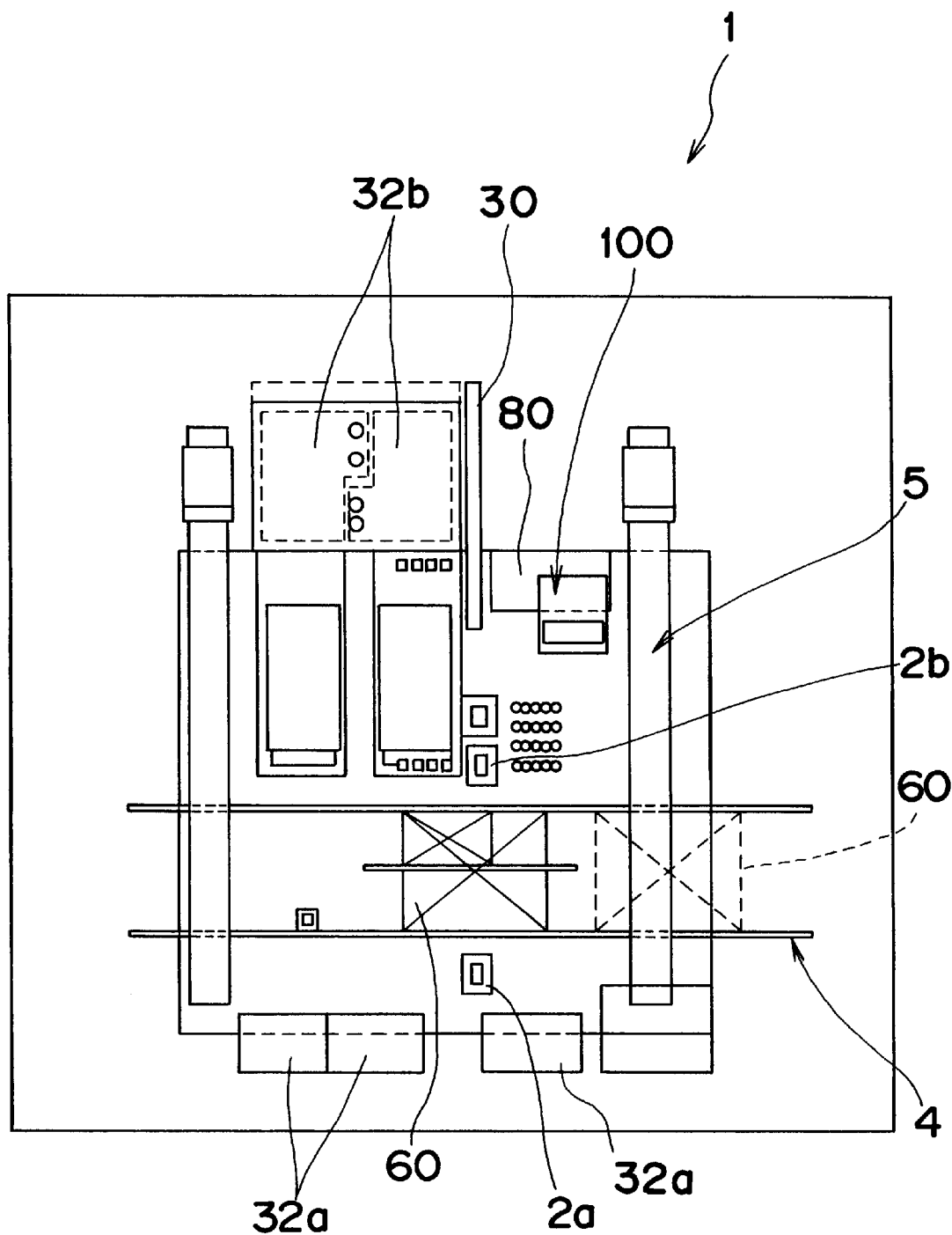
FIG. 2 is a diagram of a plane layout of the electronic component mounting apparatus shown in FIG. 1 with a part of the electronic component mounting apparatus omitted.
Figure 3:
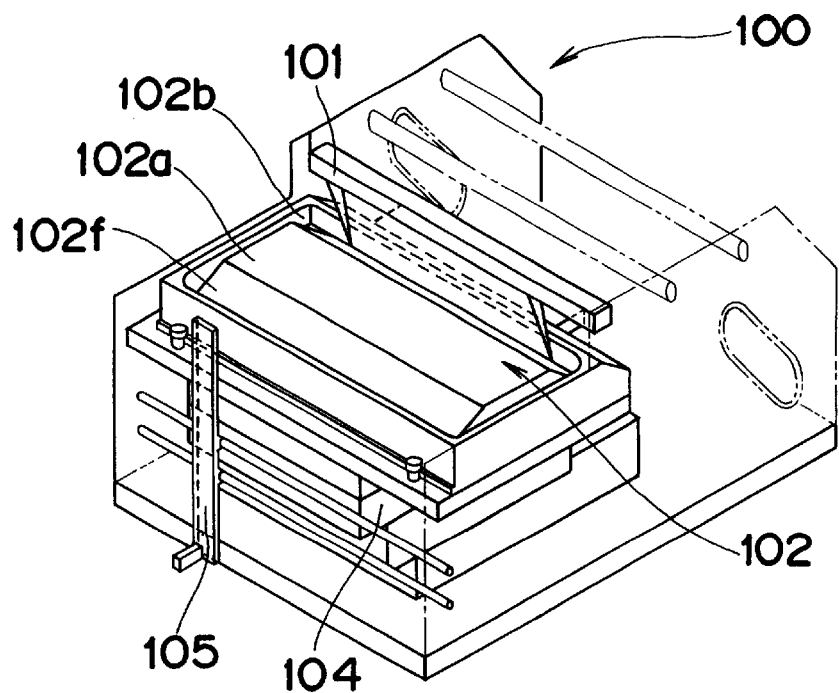
FIG. 3 is a perspective view of a solvent transfer unit of a slide type of the electronic component mounting apparatus according to the embodiment of the present invention.

As shown in FIG. 1, the electronic component mounting apparatus 1 in the embodiment has the flux transfer unit 100 at a portion where a component feed cassette is not set in a rear component feed device. The flux transfer unit 100 is constituted of a transfer stage 102, as one example of a solvent transfer unit, having recessed portions 102b, 102f for storing a flux 200, and a flat plane portion 102a for transferring the flux 200 to components 33, a film-forming and scraping blade 101 for regulating a thickness of a film 211 of the flux 200, a driving part 104, such as a motor or a cylinder, for linearly sliding the transfer stage 102 or the blade 101 (the stage 102 in FIGS. 1–4), and a signal reception part 105 for receiving a signal for driving of the driving part 104. As is clear from FIG. 2 showing a plane layout of the apparatus 1, the flux transfer unit 100 can be set at a part of the rear component feed device 32b located at the rear of the apparatus 1 by detachably being inserted the flux transfer unit 100 to one of cassette slots 80 of the rear component feed device 32b.

The thus-installed flux transfer unit 100 is used in the electronic component mounting apparatus 1 of the constitution as indicated in FIGS. 1–4.

The electronic component mounting apparatus 1 with the flux transfer unit 100 will be described now.

Figure 13:
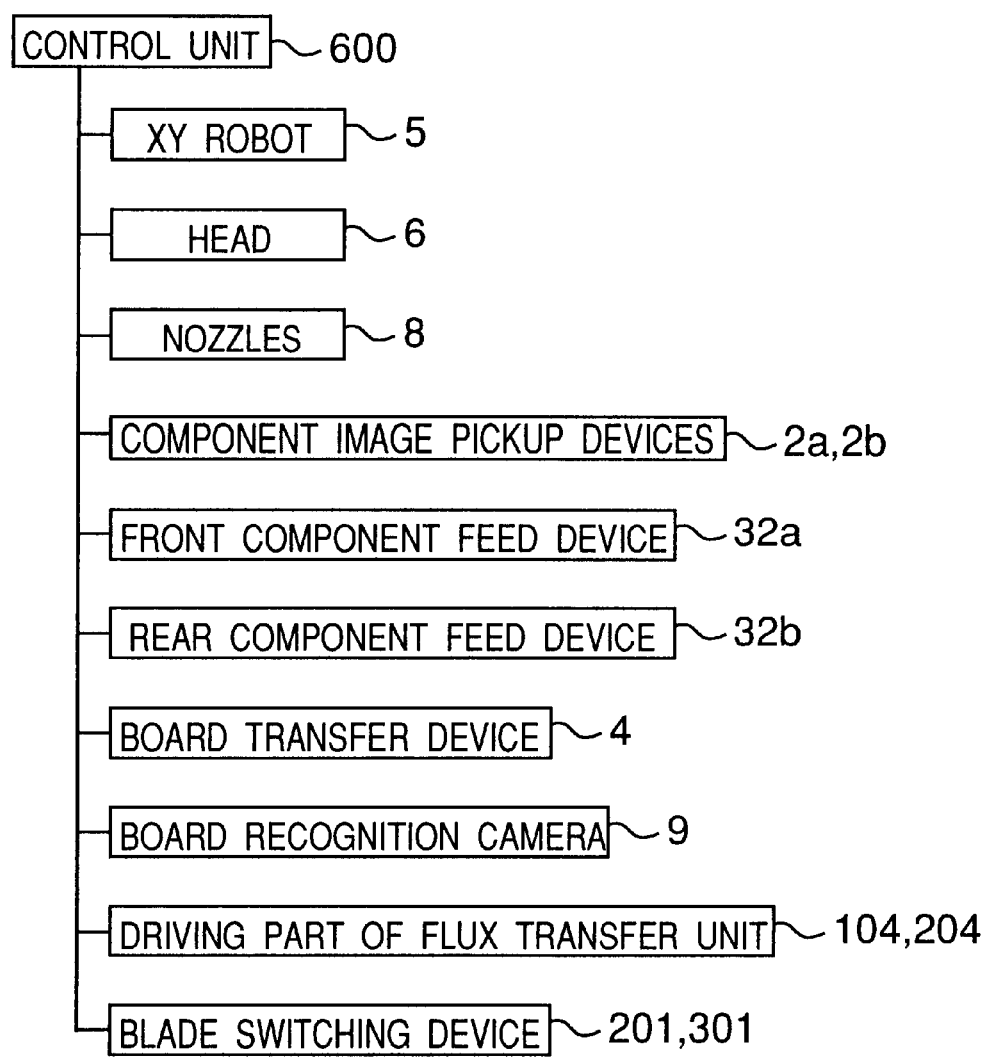
FIG. 13 is a block diagram of the electronic component mounting apparatus according to other embodiment of the present invention of FIG. 10.
Figure 14:
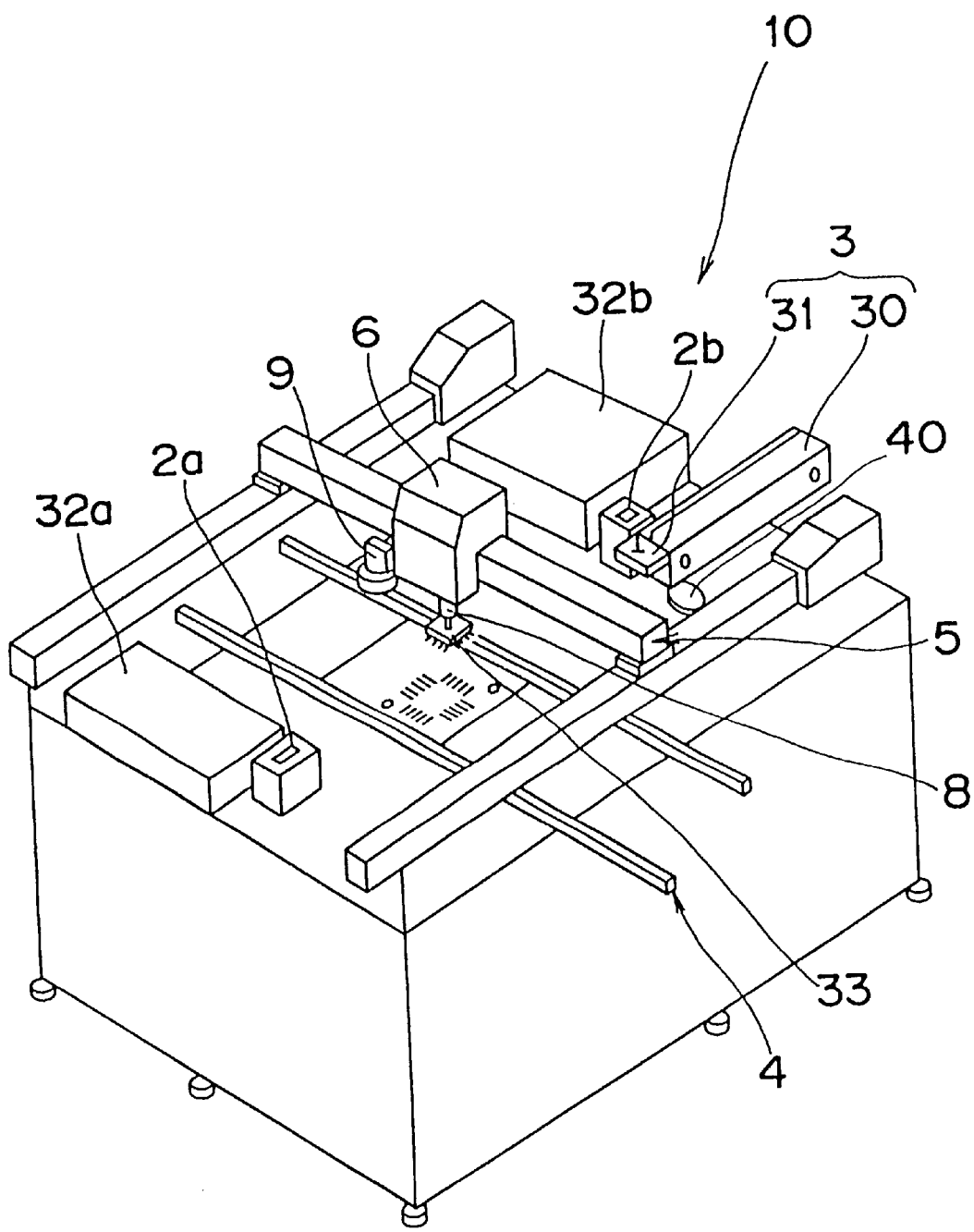
FIG. 14 is a perspective view of a conventional electronic component mounting apparatus.
Figure 15:
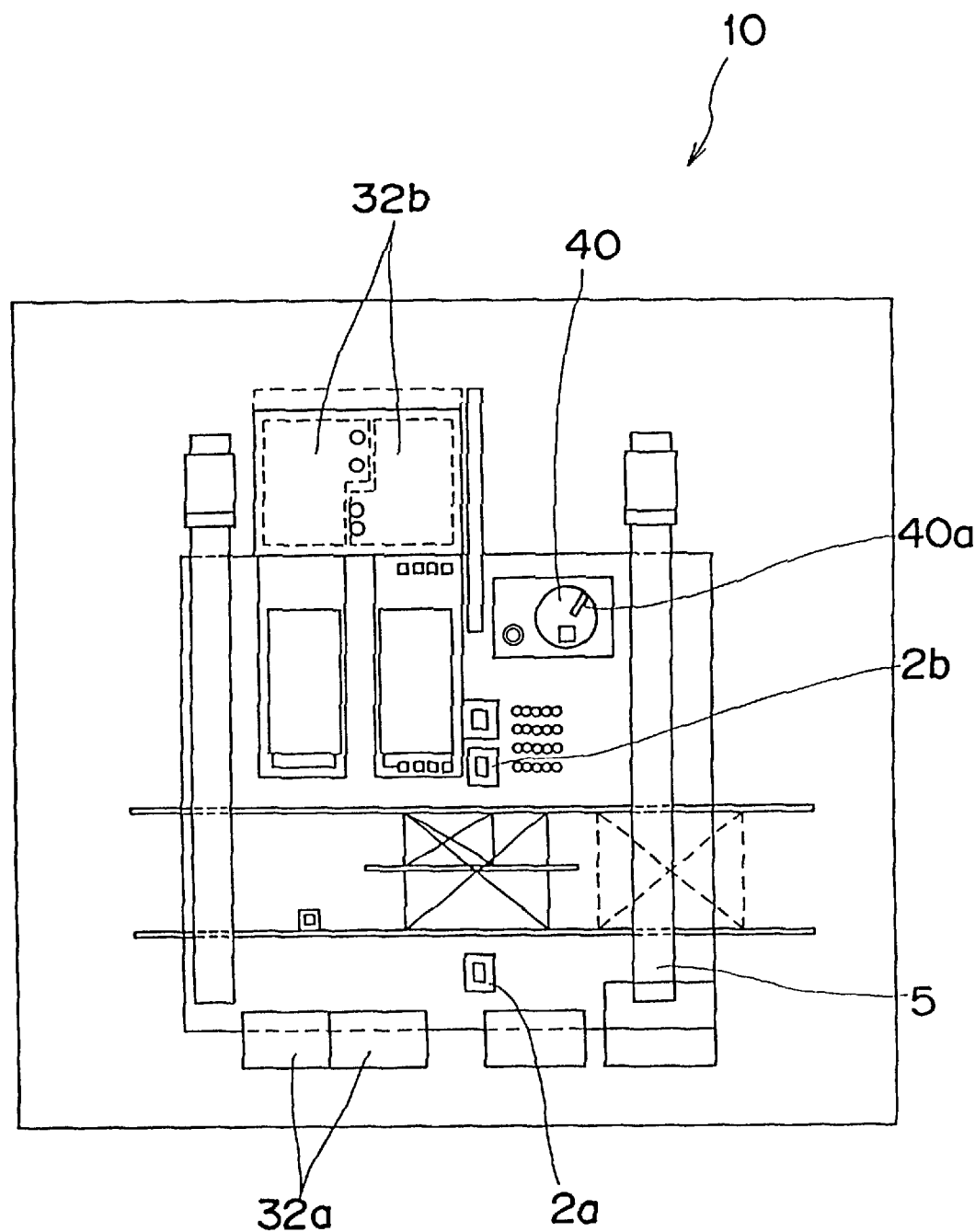
FIG. 15 is a diagram of a plane layout of the conventional electronic component mounting apparatus.
Figure 16:
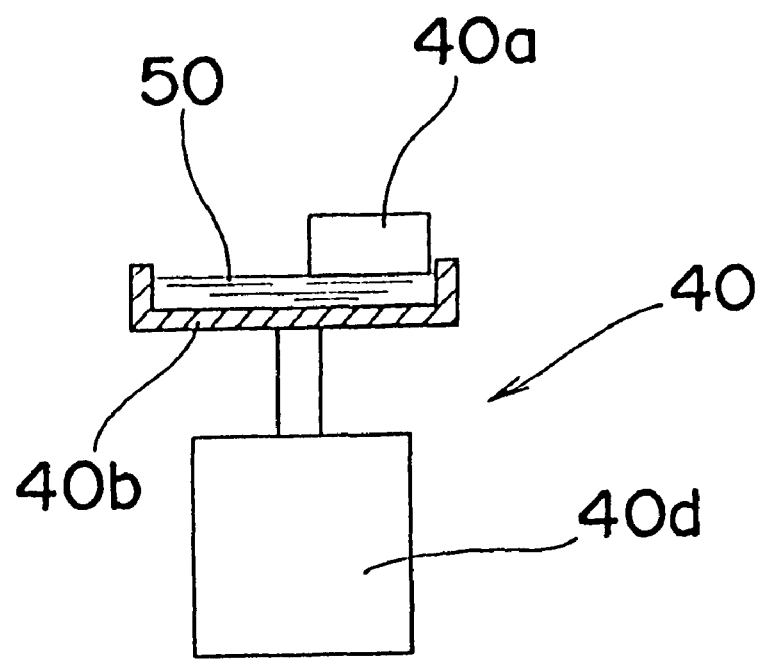
FIG. 16 is an explanatory view of a flux transfer unit of the conventional electronic component mounting apparatus.
Figure 17:
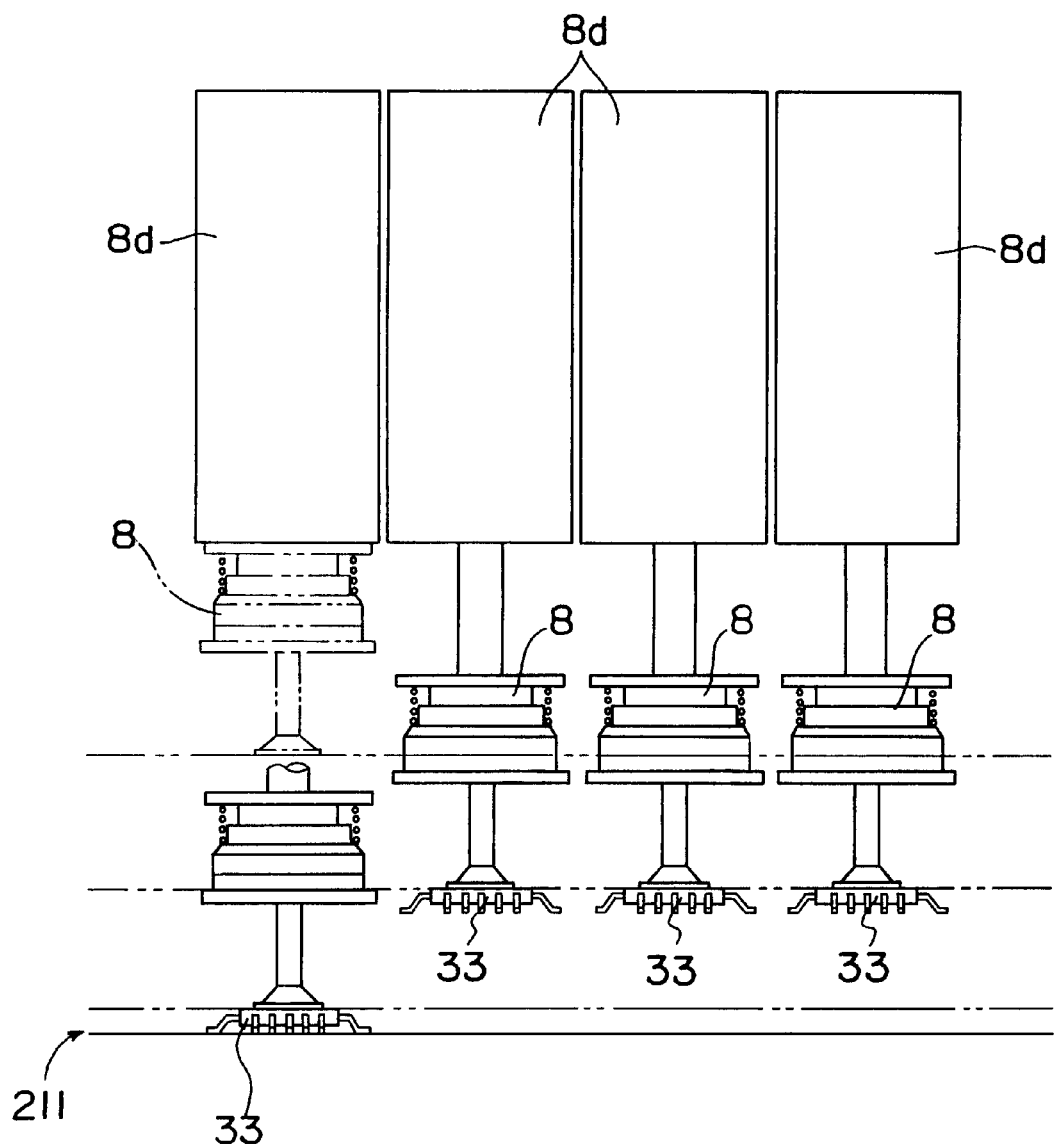
FIG. 17 is a front view of four nozzles used in the electronic component mounting apparatus according to the embodiment.

The component mounting apparatus 1 for electronic components includes a board transfer device 4, serving as one example of an object supporting device, which carries in and out circuit boards 60 and holds and positions the circuit boards 60 when components 33 are to be mounted; electronic component feed devices 32a, 32b having a plurality of electronic component feed units (for example, component feed cassettes capable of being inserted into the cassette slots 80 or component feed trays) for each accommodating the electronic components 33, a head 6 having the nozzles 8 which can hold the electronic components 33 from the feed device 32a or 32b and move the components 33 by an XY robot 5 in X and Y directions to mounting positions on the circuit boards 60, front and rear component image pickup device 2a, 2b which pick up and measure images of held attitudes of the electronic components 33 held at the nozzles 8 of the head 6, and a control unit 600 for controlling operations of at least the XY robot 5, the head 6, the nozzles 8, and the component image pickup devices 2a, 2b as shown in FIG. 13. The head 6 is equipped with the plurality of nozzles 8 for holding, e.g., by sucking the electronic components 33 and a board recognition camera 9 for picking up and thereby recognizing an image of a board mark indicated at the mounting position on the circuit board 60. It is noted that for simplification, the head 6 has one nozzle 8 in FIG. 1, but, for one example, the head 6 has four nozzles 8 capable of sucking and holding four electronic components 33. As shown in FIG. 17, each of the nozzles 8 can be independently moved upward and downward by each driving cylinder 8d under the control of the control unit 600, so that, for example, four nozzles 8 can be moved downward integrally, or only necessary nozzle(s) 8, one, two, or three nozzles 8 can be moved downward.

As shown in FIG. 13, the control unit 600 is connected to the XY robot 5, the head 6 having the plural nozzles 8, the front and rear component image pickup devices 2a and 2b, front and rear component feed device 32a and 32b, the board transfer device 4, the board recognition camera 9, and the driving part 104 of the flux transfer unit 100 to control the respective operations under the control of the control unit 600. It is noted that there are devices such as the driving part 104 or 204 of the flux transfer unit 100, and the blade switching device 201 or 301 in this embodiment are shown in FIG. 13, which is unnecessary in this embodiment, but necessary in the later embodiments.

The operation of the electronic component mounting apparatus 1, mainly the operation after recognizing the mark showing the mounting position on the board 60 by the board recognition camera 9 will be depicted hereinbelow.

In mounting the components 33 of the component feed devices 32a, 32b, under the control of the control unit 600, while the head 6 is moved in X, Y directions by the XY robot 5, the board recognition camera 9 is moved over, for example, the front component feed device 32a, the centers and inclinations of the to-be-sucked and held electronic component 33 are recognized by the board recognition camera 9, the center of each of the electronic components 33 is calculated by the control unit 600, and each of the electronic components 33 is held and sucked at the center by each of the nozzles 8. At this time, a component take-out signal indicating that the component 33 is taken out from the component feed device by the nozzle 8, for example, a component feed signal issued from the component feed cassette of the front component feed device 32a or a tape releasing signal indicating that a release tape is taken out when the component 33 is taken out from the taped component of the component feed cassette is detected at the signal reception part 105 of the flux transfer unit 100 set at the rear of the apparatus 1, and the flux transfer stage 102 is linearly slid by the driving part 104 to approximately uniform a film thickness of the flux film 211 at the flux transfer stage 102. The scraped unnecessary flux 200 is collected in the recessed portion 102b or 102f of the flux transfer stage 102, so that the flux 200 is not stagnant in one of the recessed portions and is circulated between the recessed portions at all times.

Figure 4:
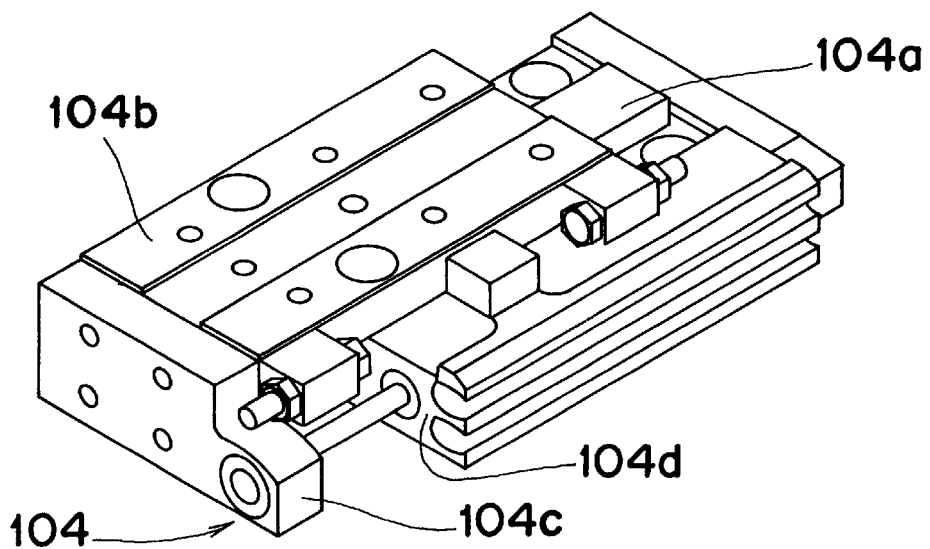
FIG. 4 is a perspective view of a driving unit of the flux transfer unit.

One example of the driving part 104 is shown in FIG. 4. By driving of a driving cylinder 104d fixed to a fixed base 104a, a movable base 104b connected to a movable part 104c of the driving cylinder 104d is linearly and reciprocally moved with respect to the fixed base 104a while guided by the fixed base 104a. The flux transfer stage 102 is fixed to the movable base 104b to linearly and reciprocally move the flux transfer stage 102. The flux transfer stage 102 has the recessed portions 102b, 102f at both ends thereof and a trapezoidal sectional portion with a flat plane portion 102a at its top between the recessed portions 102b, 102f. The film-forming and scrapping blade 101 is fixed to the side of the fixed base 104a, and a gap is defined between the lower end of the blade 101 and the flat plane portion 102a so as to form the film 211 of the flux 200 with its approximately uniform thickness. Therefore, when the flux transfer stage 102 is linearly and reciprocally moved by driving the driving cylinder 104d, the film 211 of the flux 200 with the approximately uniform thickness is formed by the flux transfer stage 102 and the blade 101 fixed to the side of the fixed base 104a. For example, in FIG. 3, when the flux transfer stage 102 is moved with respect to the fixed blade 101 from the upper right to the lower left direction, from a state where the blade 101 is inserted into the one recessed portion 102b, a part of the flux 200 stored in the one recessed portion 102b is moved to the flat plane portion 102a, a flux film 211 with its approximately uniform thickness is formed at the flat plane portion 102a by the blade 101, and then, the blade 101 together with the unnecessary flux 200 is moved into the other recessed portion 102f. Conversely, in FIG. 3, when the flux transfer stage 102 is moved with respect to the fixed blade 101 from the lower left to the upper right direction, from a state where the blade 101 is inserted into the other recessed portion 102f, a part of the flux 200 stored in the other recessed portion 102f is moved to the flat plane portion 102a, a new flux film 211 with its approximately uniform thickness is formed at the flat plane portion 102a by the blade 101, and then, the blade 101 together with the unnecessary flux 200 is moved into the one recessed portion 102b. Thus, by reciprocally and linearly moving the flux transfer stage 102, two flux films 211 with approximately uniform thicknesses are formed at the flat plane portion 102a by the blade 101.

Thereafter, the XY robot 5, that is, the head 6 holding the electronic components 33 at the suction nozzles 8 is moved in X and Y directions to the flux transfer unit 100 at the rear of the apparatus 1, the plurality of the held electronic components 33 are lowered at the same time into touch with the flux film 211 at the flux transfer stage 102 by moving downward the plural nozzles 8, and the flux 200 is transferred to the electronic components 33. The electronic components 33 to which the flux 200 is transferred are started to be moved up simultaneously to a recognition height. The electronic components 33 after the flux transfer are then moved over the rear component image pickup device 2b, where the held attitude of each electronic component 33 sucked and held by each nozzle 8 is measured and the measured result is judged whether or not the result is normal (acceptable). If the judgment result on the held attitudes of the electronic components 33 is normal, the head 6 holding the electronic components 33 at the suction nozzles 8 is set over the desired electronic circuit board 60 by moving the XY robot 5 in X and Y directions. If the judgment result on the held attitudes of the electronic components 33 is abnormal, the head 6 holding the abnormal electronic component 33 at the suction nozzles 8 is moved to a component discharge part 3 (See FIG. 1) by moving the XY robot 5 to place the abnormal electronic component 33 on a defective component place part 31 to discharge the abnormal electronic component 33 to the outside of the electronic component mounting apparatus 1.

In the embodiment as above, the flux transfer unit 100 of a slide type is set at the rear of the apparatus 1, the solvent can be transferred to the electronic components by bringing the components held by the component holding members into touch with the solvent film simultaneously after the solvent film is formed by relatively and linearly sliding one of the solvent transfer part and the blade. Therefore, the electronic components 33 sucked and held by the plurality of nozzles 8 can be lowered at the same time to transfer the flux 200 thereto. That is, since the flux 200 is transferred at once to the sucked and held electronic components 33, a time for moving the nozzles 8 up and down can be shortened in comparison with the case of the rotary type transfer unit 40 whereby a first component is moved down, the transfer saucer 40b is rotated and then a second component is lowered. A Cycle time is shortened accordingly.

It is appeared that the present invention is not limited to the above-described embodiments. Various changes and modifications can be made.

For example, the flux transfer stage may be constituted of one recessed portion and the flat plane portion. That is, as shown in FIGS. 5–8, a flux transfer stage 202 as one example of the solvent transfer unit is constituted by one recessed portion 202b and a flat plane portion 202a, and there are separately provided a film-forming blade 201b made of rigid material such as iron and a scrapping blade 201a made of elastic material such as rubber, so that the film-forming blade 201b and the scrapping blade 201a may be switched by a driving part 201c, such as a driving cylinder, of a blade switching device 201. A gap for forming a flux film is previously set between the film-forming blade 201b and the flat plane portion 202a, so that the flux film 211 with its approximately uniform thickness is formed at the flat plane portion 202a. Since no gap is set between the scrapping blade 201a and the flat plane portion 202a, the flux 200 on the flat plane portion 202a can be scrapped by the scrapping blade 201a. The flux transfer stage 202 has grooves 202g at both ends of the flat plane portion 202a which is connected to the recessed portion 202b.

Figure 5:
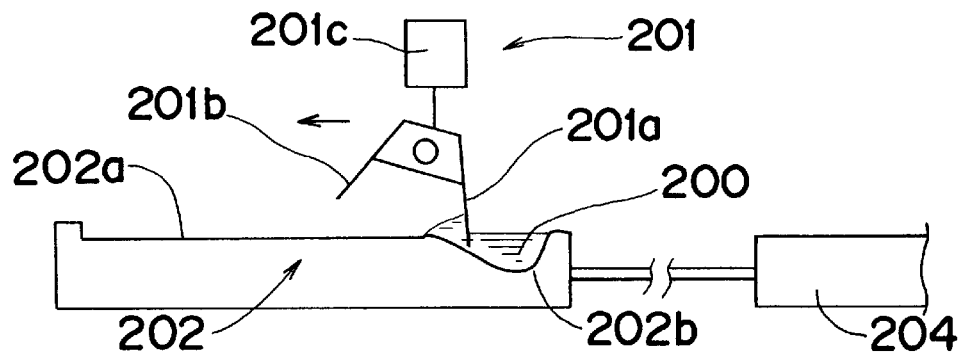
FIG. 5 is an explanatory view of a state where flux in a recessed portion of a flux transfer stage the flux is scraped up to a flat plane portion thereof by a blade when the flux transfer stage is moved with respect to the fixed blade by driving of the driving part of the flux transfer unit.
Figure 6:
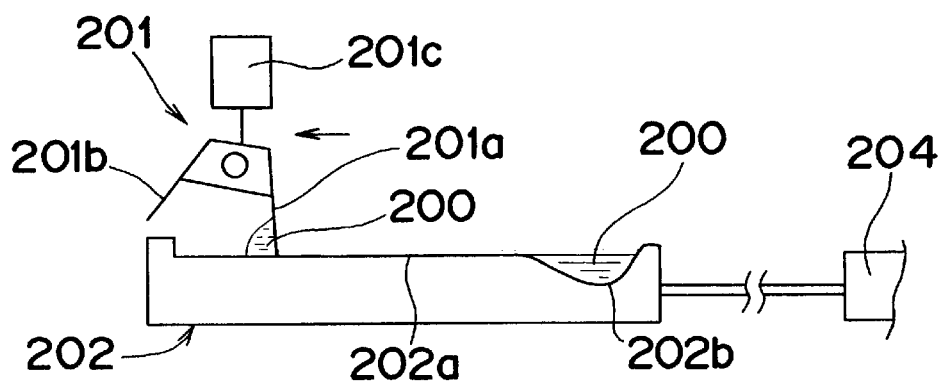
FIG. 6 is an explanatory view of a state where the flux in the recessed portion of the flux transfer stage the flux is spread on the flat plane portion thereof by the blade when the flux transfer stage is moved with respect to the blade by driving of the driving part of the flux transfer unit.
Figure 7:
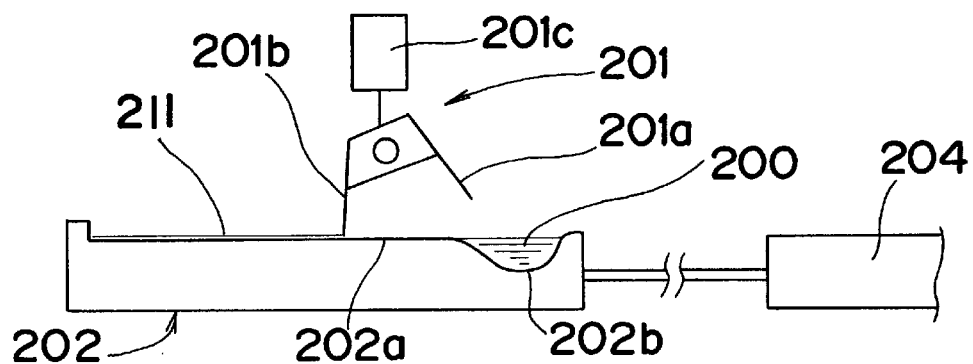
FIG. 7 is an explanatory view of a state where a film having approximately uniform thickness is formed on the flat plane portion by the blade when the flux transfer stage is moved with respect to the blade by driving of the driving part of the flux transfer unit.
Figure 8:
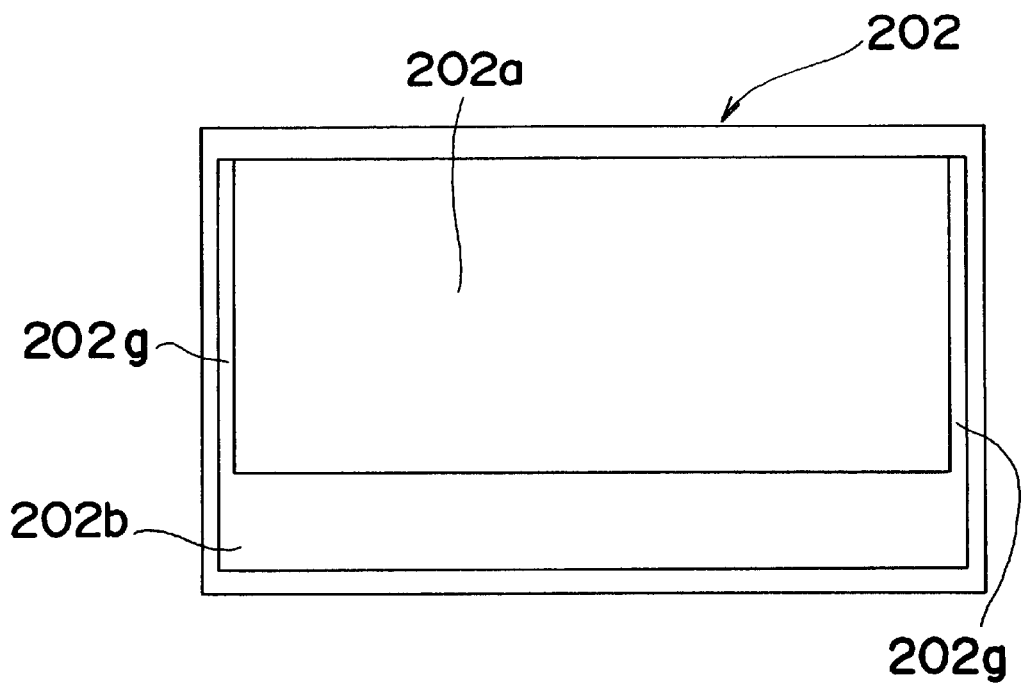
FIG. 8 is a plane view of the flux transfer unit.

According to the above construction, when the flux transfer stage 202 is linearly moved leftward in FIG. 5 by driving the driving cylinder 204, from a state where the scrapping blade 201a is inserted into the recessed portion 202b, a part of the flux 200 in the recessed portion 202b is moved to the flat plane portion 202a by the scrapping blade 201a, and then, as shown in FIG. 6, the scrapping blade 201a moves to the left end while the scrapping blade 201a scraps the almost all flux 200 on the flat plane portion 202a. Next, the scrapping blade 201a is switched to the film-forming blade 201b by the driving part 201c of the blade switching device 201. Next, the flux transfer stage 202 is linearly moved rightward in FIG. 5 by driving the driving cylinder 204, so that as shown in FIG. 7, the film-forming blade 201b moves to the right end, that is, the recessed portion 202b while a flux film 211 having its approximately uniform thickness is formed at the flat plane portion 202a by the film-forming blade 201b. According to the construction, the flux film 211 having its approximately uniform thickness is formed at the flat plane portion 202a by the film-forming blade 201b and the unnecessary left flux 200 on the flat plane portion 202a can be surely scrapped by the scrapping blade 201a after the components 33 are bought into contact with the flux film 211. Thus, it is easy to form a flux film 211 having its approximately uniform thickness when the film 211 is formed.

Figure 9:
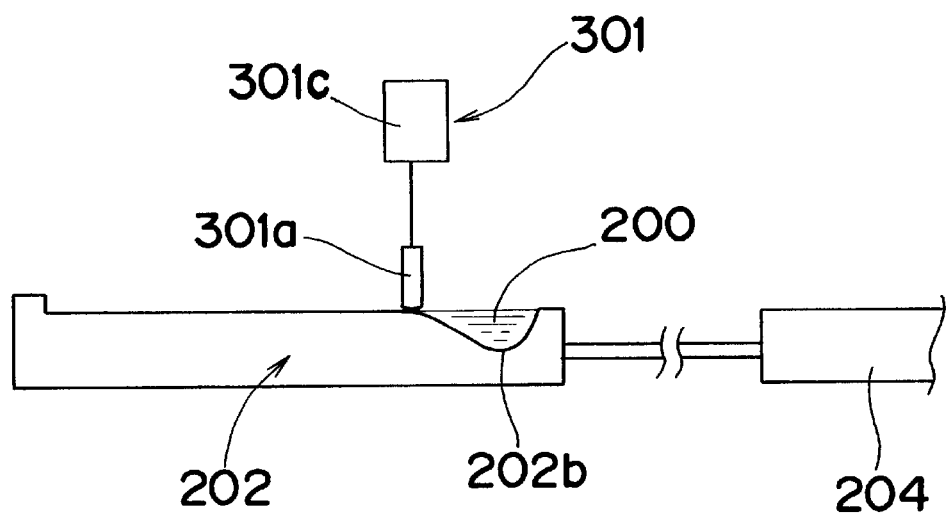
FIG. 9 is an explanatory view of a flux transfer unit of a slide type in the electronic component mounting apparatus according to other embodiment of the present invention.

Furthermore, as other construction, as shown in FIG. 9, in the above construction shown in FIGS. 5–8, one blade 301a can be used for a scrapping blade and a film-forming blade to adjust a gap between the lower end of the blade 301a and the flat plane portion 202a by a driving part 301c of a switching device 301, so that the scrapping operation and the film forming operation can be suitably carried out.

Figure 10:
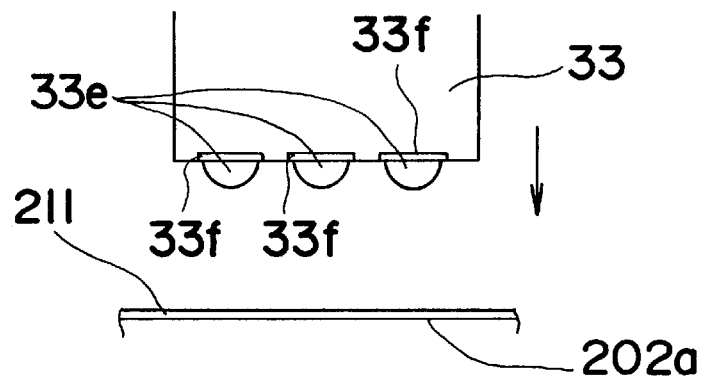
FIG. 10 is an explanatory view of a state where bumps are made flat by using the flux transfer unit of a slide type in the electronic component mounting apparatus according to other embodiment of the present invention.
Figure 11:
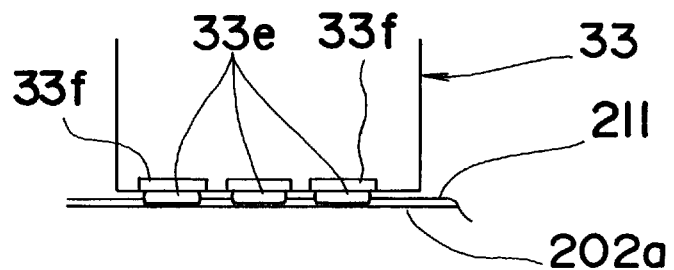
FIG. 11 is an explanatory view of a state where bumps are made flat by using the flux transfer unit of a slide type in the electronic component mounting apparatus according to other embodiment of the present invention of FIG. 10.
Figure 12:
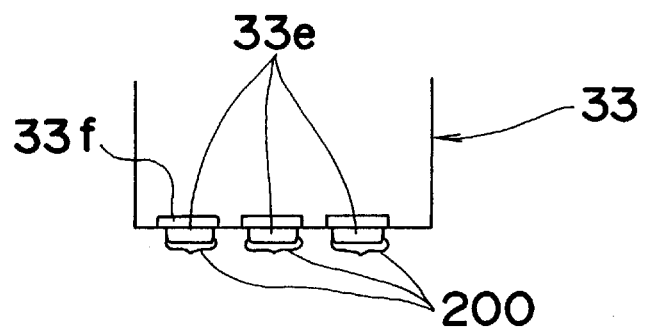
FIG. 12 is an explanatory view of a state where bumps were made flat by using the flux transfer unit of a slide type in the electronic component mounting apparatus according to other embodiment of the present invention of FIG. 10.

Moreover, as shown in FIGS. 10–12, the solvent transfer unit has at the solvent transfer part 202 a flat plane portion 202a made of rigid material, and when the flux 200 is transferred to the components 33, the flux 200 is transferred to bumps 33e formed on electrodes 33f of the plural electronic components 33 while leveling the bumps 33e by pressing the bumps 33e against the flat plane portion 202a of the solvent transfer part 202 with a force of, for example, 400 (g/100-bumps). According to the construction, the bumps 33e can be leveled at a constant height and becomes having an affinity for the solvent 200 by aligning the bottom surfaces of the bumps 33e. In this construction, the bumps 33e can be pressed against the flat plane portion 202a of the solvent transfer part 202 in a plurality of steps, depending on the electronic component 33. The above leveling operation can be applied to not only the plural components 33 held by the plural nozzles 8 but one component 33 held by one nozzle 8.

When the transfer operation to the components 33 is continuously carried out, the flux 200 can be supplied to the solvent transfer part 202 after a predetermined number of the transfer operations is finished or after a predetermined time of period is elapsed.

In the solvent transfer operation, it is not limited to transfer the solvent 200 to the components 33 one time. The solvent 200 can be transferred to the components 33 two times or more. For example, a first transfer operation of transferring the solvent 200 to the components 33 may be carried out so that the components 33 have an affinity for the solvent 200 and thereafter a second transfer operation of transferring the solvent 200 to the components 33 may be carried out so that the solvent 200 is sufficiently transferred to the components 33.

In the respective flux transfer stages 102, 202, the respective flat plane portions 102a, 202a preferably have such widths that the solvent can be transferred to, for example, four components 33.

Moreover, when for example, four nozzles 8 hold the four components 33 as shown in FIG. 17 and the four components 33 need the solvent transfer operation, the four nozzles 8 simultaneously may move downward to the flux transfer stage 102, 202 to transfer the flux 200 to the four components 33. When two of the four components 33 need the solvent transfer operation, the two of four nozzles 8 may move downward to the flux transfer stage 102, 202 to transfer the flux 200 to the two components 33.

In the embodiments shown in FIGS. 5–12, as shown in FIG. 13, the control unit 600 is connected to the XY robot 5, the head 6 having the plural nozzles 8, the front and rear component image pickup devices 2a and 2b, front and rear component feed device 32a and 32b, the board transfer device 4, the board recognition camera 9, the driving part 104 or 204 of the flux transfer unit 100, and the blade switching device 201 or 301 to control the respective operations under the control of the control unit 600.

As is discussed in detail above, in the electronic component mounting apparatus with the solvent transfer unit of a slide type set at the rear of the apparatus according to the present invention, and in the electronic component mounting method including the solvent transfer operation according to the present invention, the solvent can be transferred to the electronic components by bringing the components held by the component holding members into touch with the solvent film simultaneously after the solvent film is formed by relatively and linearly sliding one of the solvent transfer part and the blade. Therefore, the plurality of nozzles are enabled to move up and down simultaneously at the solvent transfer operation, so that a movement time is reduced as compared with the case of moving up, down the nozzles one by one, thereby shortening the Tact time (cycle time) and eventually improving production efficiency.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting apparatus comprising:
    a component feed device for feeding a plurality of electronic components;
    an object support device for holding and positioning an object to which the electronic components are to be mounted;
    a plurality of component holding members for holding the electronic components from the component feed device and mounting the held electronic components to predetermined positions on the object;
    a component image pickup device for measuring attitudes of the electronic components held by the component holding members; and
    a solvent transfer unit, comprising: a solvent transfer part for forming a film of a solvent to be transferred to the components; and a film-forming blade for forming the solvent film at the solvent transfer part, for transferring the solvent to the electronic components by bringing the components held by the component holding members into contact with the solvent film simultaneously after the solvent film is formed by relatively and linearly sliding one of the solvent transfer part and the blade.

2. An electronic component mounting apparatus according to claim 1, wherein the solvent transfer unit has at the solvent transfer part a flat planar portion at which the solvent film is formed and has a driving part for relatively and linearly sliding one of the solvent transfer part and the film-forming blade, thereby regulating a film thickness of the solvent thereat through movement of the solvent transfer part or the blade thereby making the film thickness of the solvent approximately uniform.

3. An electronic component mounting apparatus according to claim 1, wherein the component feed device has cassette slots in which component feed cassettes can be disposed, and the solvent transfer unit is capable of being inserted into one of the cassette slots of the component feed device to set the solvent transfer unit at the apparatus.

4. An electronic component mounting apparatus according to claim 2, wherein the component feed device has cassette slots in which component feed cassettes can be disposed, and the solvent transfer unit is capable of being inserted into one of the cassette slots of the component feed device to set the solvent transfer unit at the apparatus.

5. An electronic component mounting apparatus according to claim 1, wherein in the solvent transfer unit, one of the solvent transfer part and the blade is slid in accordance with a component take-out signal indicating that the component is taken out by the component holding member from a component feed cassette attached at a cassette slot of the component feed device.

6. An electronic component mounting apparatus according to a claim 2, wherein in the solvent transfer unit, one of the solvent transfer part and the blade is slid in accordance with a component take-out signal indicating that the component is taken out by the component holding member from a component feed cassette attached at a cassette slot of the component feed device.

7. An electronic component mounting apparatus according to claim 3, wherein in the solvent transfer unit, one of the solvent transfer part and the blade is slid in accordance with a component take-out signal indicating that the component is taken out by the component holding member from a component feed cassette attached at one of the cassette slots of the component feed device.

8. An electronic component mounting apparatus according to claim 1, wherein the solvent transfer unit has the film-forming blade and a scraping blade for scraping unnecessary solvent, and after the film of the solvent is formed at the solvent transfer part by relatively and linearly sliding one of the solvent transfer part and the film-forming blade, the plural electronic components held by the component holding members are brought into contact with the film of the solvent to transfer the solvent to the held components, and after the solvent left at the solvent transfer part is scraped by the scraping blade, a new film of the solvent is formed at the solvent transfer part.

9. An electronic component mounting apparatus according to claim 2, wherein the solvent transfer unit has the film-forming blade and a scraping blade for scraping unnecessary solvent, and after the film of the solvent is formed at the solvent transfer part by relatively and linearly sliding one of the solvent transfer part and the film-forming blade, the plural electronic components held by the component holding members are brought into contact with the film of the solvent to transfer the solvent to the held components, and after the solvent left at the solvent transfer part is scraped by the scraping blade, a new film of the solvent is formed at the solvent transfer part.

10. An electronic component mounting apparatus according to claim 3, wherein the solvent transfer unit has the film-forming blade and a scraping blade for scraping unnecessary solvent, and after the film of the solvent is formed at the solvent transfer part by relatively and linearly sliding one of the solvent transfer part and the film-forming blade, the plural electronic components held by the component holding members are brought into contact with the film of the solvent to transfer the solvent to the held components, and after the solvent left at the solvent transfer part is scraped by the scraping blade, a new film of the solvent is formed at the solvent transfer part.

11. An electronic component mounting apparatus according to claim 5, wherein the solvent transfer unit has the film-forming blade and a scraping blade for scraping unnecessary solvent, and after the film of the solvent is formed at the solvent transfer part by relatively and linearly sliding one of the solvent transfer part and the film-forming blade, the plural electronic components held by the component holding members are brought into contact with the film of the solvent to transfer the solvent to the held components, and after the solvent left at the solvent transfer part is scraped by the scraping blade, a new film of the solvent is formed at the solvent transfer part.

12. An electronic component mounting apparatus according to claim 1, wherein the solvent transfer unit has a flat planar portion at the solvent transfer part, and when the solvent is transferred to the components, the solvent is transferred to bumps formed on electrodes of the plural electronic components while leveling the bumps by pressing the bumps against the flat planar portion of the solvent transfer part.

* * * * *